United States Patent [19]

Welty

[11] 4,285,800
[45] Aug. 25, 1981

[54] GAS PLASMA REACTOR FOR CIRCUIT BOARDS AND THE LIKE

[75] Inventor: Joseph M. Welty, Hayward, Calif.

[73] Assignee: Branson International Plasma Corp., Hayward, Calif.

[21] Appl. No.: 31,055

[22] Filed: Apr. 18, 1979

[51] Int. Cl.³ .............................................. C23F 1/00
[52] U.S. Cl. .................................... 204/298; 156/345; 156/643; 204/192 E; 250/531
[58] Field of Search ................ 204/192 E, 298, 164; 156/345, 643, 646; 250/531

[56] References Cited

U.S. PATENT DOCUMENTS

| 3,414,503 | 12/1968 | Brichard | 204/298 |
| 4,012,307 | 3/1977 | Phillips | 204/192 E |

OTHER PUBLICATIONS

John L. Voseen et al., *Thin Film Processes*, Academic Press, New York, 1978, pp. 509–510.
H. A. Clark and E. D. Purcell, Wafer Holder, IBM Technical Disclosure Bulletin, vol. 19, No. 10, Mar. 1977, p. 3734.

*Primary Examiner*—Delbert E. Gantz
*Assistant Examiner*—William Leader
*Attorney, Agent, or Firm*—Flehr, Hohbach, Test, Albritton & Herbert

[57] ABSTRACT

Gas plasma reactor for treatment of printed circuit boards and other relatively large, generally planar objects. The reactor includes a rack assembly having a plurality of spaced apart bars for holding the objects and a pair of generally planar electrodes positioned outside the rack assembly. The rack assembly is maintained at ground potential, and the electrodes are energized with RF energy to form an ionizing field between the electrodes and the rack bars.

3 Claims, 3 Drawing Figures

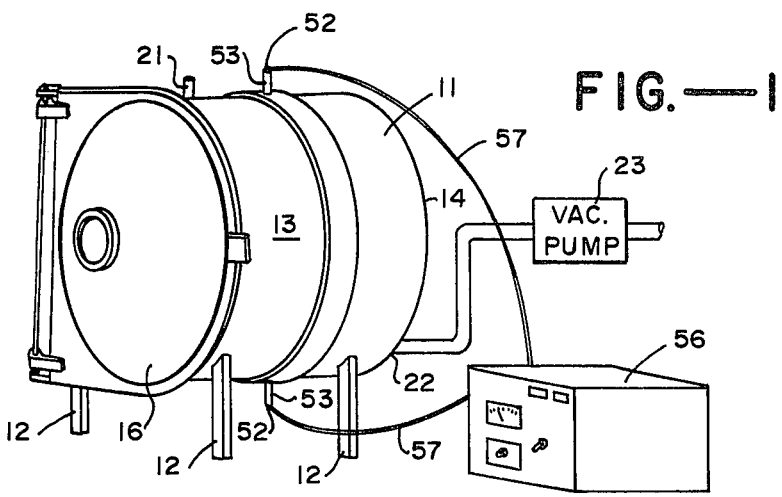
FIG.—1
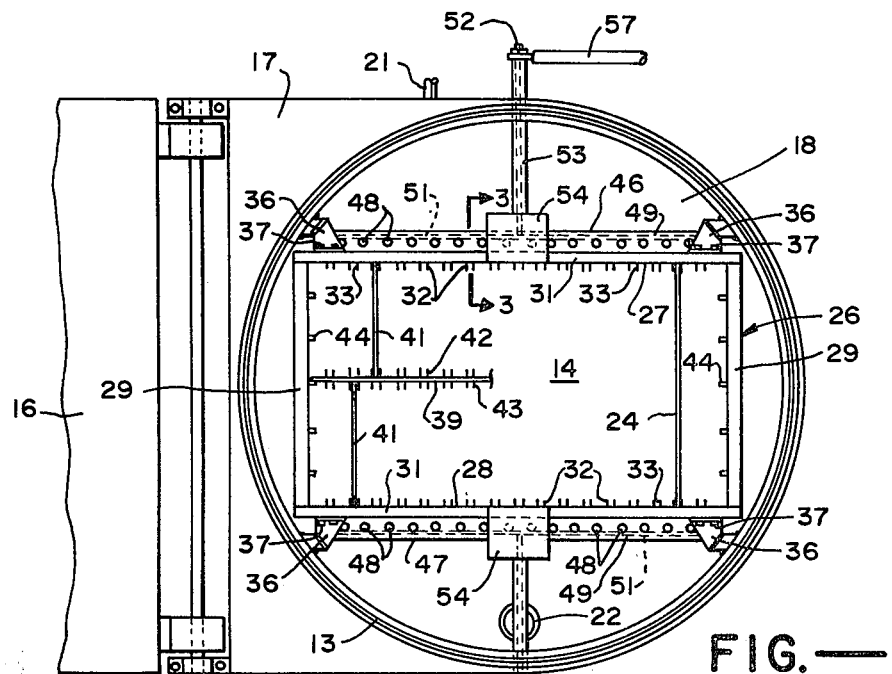
FIG.—2
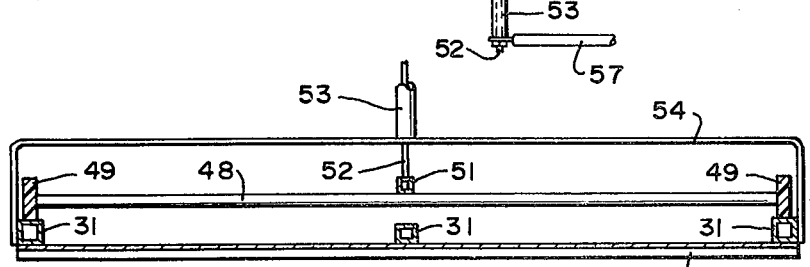
FIG.—3

GAS PLASMA REACTOR FOR CIRCUIT BOARDS AND THE LIKE

This invention pertains generally to gas plasma reactors and more particularly to a plasma reactor for treatment of relatively large, generally planar objects such as printed circuit boards.

Plasma etching has been employed in recent years in the processing of printed circuit boards, for example, to remove insulation and other foreign matter or debris from holes formed in the boards. The holes are typically formed by drilling, and the drilling operation can cause insulation and/or adhesive to be smeared on the conductive foil around the edges of the holes where it can prevent good electrical connections if not removed. In addition, fragments of insulation and/or the conductive foil can become lodged in the holes and cause similar problems.

Reactors heretofore employed in the treatment of printed circuit boards have generally had a perforated cylindrical electrode within the reactor chamber. The boards to be treated are placed within the electrode, and an electrical field is applied between the electrode and the reactor housing to ionize the reagent gas and generate a plasma. This arrangement is subject to certain limitations and disadvantages in that, for example, the electrode is ungrounded and presents a shock hazard to operating personnel in the event that it is inadvertently left in an energized state while the boards are being loaded into or removed from the reactor. In addition, because of the curvature of the electrode, the plasma is formed at different distances from boards at different locations in the reactor, and this can result in nonuniform treatment of the boards.

It is in general an object of the invention to provide a new and improved reactor for plasma treatment of printed circuit boards and other generally planar objects.

Another object of the invention is to provide a reactor of the above character having an improved rack and electrode structure for holding and treating the boards.

Another object of the invention is to provide a reactor of the above character in which the circuit board rack is grounded and the operator is protected by the rack from inadvertent contact with the electrode.

These and other objects are achieved in accordance with the invention by providing a gas plasma reactor which has first and second racks connected electrically to ground, with a plurality of spaced apart generally parallel bars for engaging opposing edges of printed circuit boards to hold the boards in spaced parallel relationship. A pair of generally planar electrodes is provided adjacent to the racks, and the electrodes are energized to form a field between the electrodes and the racks for ionizing the gas to form the plasma.

FIG. 1 is an isometric view, somewhat schematic, of one embodiment of a reactor incorporating the invention.

FIG. 2 is a fragmentary elevational view of the reactor of FIG. 1, with the chamber door in an open position.

FIG. 3 is an enlarged cross-sectional view taken along line 3—3 of FIG. 2.

The reactor includes a generally cylindrical housing 11 supported by legs 12 with the axis of the housing extending in a generally horizontal direction. The housing includes a cylindrical side wall 13, a rear wall 14 and a door 16 hingedly mounted on a plate 17 at the front of the housing for movement between open and closed positions. The housing is fabricated of an electrically conductive metal and is connected electrically to ground by a suitable ground lead (not shown). A reaction chamber 18 is formed within the housing.

Means is provided for introducing gas into the reaction chamber and removing gas from the chamber. This means includes a gas inlet 21 and an outlet 22 which communicate with the chamber through openings in the top front portion of the side wall and the lower portion of the rear wall. The inlet is adapted for connection to suitable sources of gas (not shown), and the outlet is connected to a vacuum or exhaust pump 23. Suitable etching gases for cleaning the holes in the printed circuit boards include $CF_4$ and mixtures of $CF_4$ and oxygen.

Means is provided for holding a plurality of printed circuit boards 24 in a spaced parallel relationship within the reactor chamber. This means includes a generally rectangular rack assembly comprising an upper rack 27, a lower rack 28, and side plates 29. Each of the racks includes a plurality of frame members 31 which extend horizontally between the side plates and a plurality of spaced apart bars 32 carried by the frame members for engaging opposing edges of the circuit boards. These bars extend in a direction generally parallel to the axis of the chamber and are generally U-shaped in cross section, defining inwardly facing channels 33 for receiving the upper and lower margins of the circuit boards. The bars of the upper rack are aligned vertically with the bars of the lower rack, and the circuit boards are held in a generally upright position.

The rack assembly is mounted in a generally coaxial position within the reactor chamber by means of mounting bracket 36. In embodiment illustrated, the mounting brackets are welded to the side wall of the housing, and the front and rear frame members of the racks are secured to the brackets by screws 37. The rack assembly is fabricated of an electrically conductive material and is grounded electrically to the reactor housing through the mounting brackets.

The rack assembly also includes a third rack 39 which can be mounted at different heights between the upper and lower racks to accommodate circuit boards of different sizes, e.g., boards 41 in FIG. 2. Rack 39 includes spaced apart bars 42,43 with upwardly and downwardly facing channels aligned vertically with the bars of the upper and lower racks. A plurality of vertically spaced rails 44 carried by end plates 29 provides means for supporting the third rack at the desired height.

A pair of generally planar electrodes 46,47 are mounted in the reactor chamber above and below the upper and lower racks, respectively. Each of the electrodes includes a plurality of spaced apart, electrically conductive rods 48 which extend between insulative blocks 49 carried by the front and rear frame members 31 of the rack assembly. The electrode rods are spaced from and generally parallel to the circuit board holding bars of the rack assembly, and in the embodiment illustrated, the rods are offset horizontally between the rack bars. The rods in each of the electrodes are connected together by an electrically conductive bar 51 which extends transversely of the rods. Electrical connections to the electrodes are made by means of conductors 52 which extend from the chamber through openings and feed-through insulators 53 in the upper and lower portions of side wall 13. The inner ends of conductors 52 are connected to conductive bars 51, and the inner ends of the feed-through insulators are supported by U-shaped mounting brackets 54 secured to the front and rear frame members of the rack assembly. The output of an RF generator 56 is connected to the outer ends of conductors 52 by leads 57, and a conventional ground connection (not shown) is provided between the generator and the reactor housing and rack assembly.

Operation and use of the reactor is as follows. The circuit boards to be treated are loaded into the rack assembly through the open end of the housing. Door 16 is then closed, and pump 23 is actuated to reduce the pressure in the chamber to the desired level. Reagent gas is admitted to the chamber through inlet 21, and generator 56 is actuated to energize the electrodes. An electric field is created between each of the electrodes and the adjacent rack. The fields ionize the gas to form a plasma in these regions, and the active species of the plasma pass between the bars of the racks to the circuit boards. When the etching or other reaction has been completed, the generator is turned off and the chamber is purged. The chamber is then returned to atmospheric pressure, and the door is opened for removal of the treated boards.

It should be noted that the reactor is inherently safe in that the rack assembly is maintained at ground potential and only the electrodes are energized. The electrodes are located outside the rack assembly where they are not likely to be contacted inadvertently by an operator loading or unloading circuit boards. The plasma is generated away from the boards, and because of the planar geometry of the electrodes, the active species are created a uniform distance from all of the boards. This has been found to provide more uniform etching from board to board than has heretofore been possible with the cylindrical electrodes of the prior art.

It is apparent from the foregoing that a new and improved reactor has been provided for treatment of circuit boards and other planar objects. While only one presently preferred embodiment has been described in detail, as will be apparent to those familiar with the art, certain changes and modifications can be made without departing from the scope of the invention as defined by the following claims.

What is claimed is:

1. In a gas plasma reactor for treating printed circuit boards: a housing defining a reaction chamber, gas inlet and outlet means communicating with the chamber, first and second racks connected electrically to ground and having a plurality of spaced apart generally parallel bars for engaging opposing edges of the printed circuit boards to hold the boards in spaced parallel relationship in the region between the racks, a pair of generally planar electrodes oriented in a position generally perpendicular to the surfaces of the circuit boards and positioned outside the region between the racks, each of said electrodes comprising a plurality of spaced apart rods aligned between the bars of the racks and connected electrically together, and means for energizing the electrodes to ionize the gas to form a plasma in the region between the electrodes and the racks.

2. The reactor of claim 1 wherein the housing comprises a cylindrical side wall, a rear wall and a door movable between open and closed positions on the front of the housing providing access to the region between the electrodes.

3. The reactor of claim 1 together with a third rack positioned between the first and second racks for cooperation therewith to hold circuit boards of lesser extent than the boards held by the first and second racks.

* * * * *